United States Patent [19]

Needham

[11] Patent Number: 5,280,335

[45] Date of Patent: Jan. 18, 1994

[54] FIBER-OPTICAL TESTING SYSTEM HAVING A DETECTION CIRCUIT

[75] Inventor: Francis L. Needham, Fredericksburg, Va.

[73] Assignee: The United States of America as represented by the Secretary of the Navy, Washington, D.C.

[21] Appl. No.: 888,074

[22] Filed: May 26, 1992

[51] Int. Cl.$^5$ .................. H01L 27/14; H01L 31/00; H03F 17/00; H03K 19/14

[52] U.S. Cl. .................. 356/73.1; 250/338.1; 250/338.4; 250/341; 250/370.14; 307/308; 307/311; 330/59; 330/308

[58] Field of Search .................. 356/73.1; 250/338.4, 250/338.1, 370.14, 341; 307/308, 311; 330/59, 308

[56] References Cited

U.S. PATENT DOCUMENTS

| | | | |
|---|---|---|---|
| 4,218,613 | 8/1980 | Bletz | 250/214 A |
| 4,313,067 | 1/1982 | White | 307/494 |
| 4,730,128 | 3/1988 | Seki | 307/310 |
| 4,750,217 | 6/1988 | Smith et al. | 330/59 |
| 4,795,905 | 1/1989 | Zierhut | 250/338.1 |
| 4,968,898 | 11/1990 | Hushimi et al. | 307/268 |
| 5,013,904 | 5/1991 | Muro | 250/214 R |
| 5,103,122 | 4/1992 | O'Leary et al. | 307/491 |

OTHER PUBLICATIONS

Simpson, R. E., Intro. Electronics for Scientists & Engineers., 2nd ed., 1987., pp. 378-379.

Primary Examiner—Robert J. Warden
Assistant Examiner—L. M. Crawford
Attorney, Agent, or Firm—John D. Lewis; Jacob Shuster

[57] ABSTRACT

A system for testing a fiber-optic component with infrared radiation is provided. The testing system has a source of infrared radiation, an optic coupler, a detecting circuit, and an analog tape recorder. The optic coupler directs the infrared radiation onto the fiber-optic component. The detection circuit is electrically connected to the tape recorder. The detection circuit has an amplifier, a potentiometer connected in parallel to the amplifier, and a photoelectric transducer connected in series to the amplifier. These components are mounted on a non-conductive board. A power source supplies voltage and is connected to the amplifier. The circuit operates by having the photoelectric transducer sense the infrared radiation emitted from the tested fiber-optic component and convert the radiation into an electrical signal. The amplifier then amplifies the electrical signal to the voltage necessary for driving the tape recorder.

20 Claims, 4 Drawing Sheets

FIBER-OPTICAL TESTING SYSTEM HAVING A DETECTION CIRCUIT

ORIGIN OF THE INVENTION

The invention described herein was made in the performance of official duties by an employee of the Department of the Navy and may be manufactured, used, licensed by or for the Government for any governmental purpose without payment of any royalties thereon.

FIELD OF THE INVENTION

The present invention relates generally to devices for testing fiber-optic components and more specifically to a testing system having a circuit for detecting emitted infrared radiation.

BACKGROUND OF THE INVENTION

Fiber-optic components, including switches, connectors, and mechanical splices, which are used in naval weapons systems typically undergo rigorous mechanical shock and vibration. This shock and vibration significantly affects the performance of the fiber-optic components and, in turn, the naval weapons systems. A capability of detecting any optic changes which occur during mechanical shock and vibration would therefore enhance the overall performance of the weapons system.

Prior art devices for testing fiber-optic components include systems comprising a light source, an optic coupler, an analog detector circuit, and an analog tape recorder. These systems commonly use a commercially available detector circuit which has a power supply. The detector circuit measures the amount of light emitted by converting the light into an electric signal and then amplifying the signal to a voltage which can drive the analog tape recorder.

The devices used to convert the emitted light for these detector circuits comprise photoelectric transducers, which are almost exclusively semiconductor photodiodes. The currents supplied by these receivers are proportional over more than eight orders of magnitude to the light incident upon them when operated in a conducting state, i.e., when the voltage on these devices is kept very small. Thus, the devices which perform the amplification of electrical signals for the electrical circuit should require a low voltage.

One device capable of amplification at a low voltage is an operational amplifier. Operational amplifiers have a feedback branch, and the feedback resistance in this branch must be as high as possible to optimize performance because low voltages become submerged in noise. Typically, the feedback branch has an element with a nonlinear, e.g. exponential, characteristic. This element results in the voltage at the output of the amplifier becoming a logarithmic measure of the light incident upon the photoelectric transducer. The disadvantage of this design is that the upper angular frequency of the transfer range varies with the level of steady light. For the case of low illumination intensities, the signal frequencies of interest become uncontrollably cut. As a result, the detector circuit as a whole has a narrow dynamic range of sensitivity.

Examples of prior art for detector circuits with operational amplifiers include U.S. Pat. No. 4,218,613 by Bletz. Bletz discloses a circuit for amplifying electric signals obtained by a photoelectric transducer as a function of the intensity of illumination upon the transducer. The circuit comprises an operational amplifier connected in series with the photoelectric transducer and having a feedback branch. The feedback branch has an electrical element with a nonlinear characteristic connected in parallel with a resistance. The nonlinear electrical element is either a diode or a transistor having its base at zero potential. This circuit attempts to have optimum noise control with a wide dynamic range.

Another example of prior art is U.S. Pat. No. 4,795,905 by Zierhut, which discloses a circuit layout for an infrared room surveillance detector. This circuit comprises a high impedance operational amplifier connected directly to the terminals of a pyrometer used as an infrared sensor. The reaction resistor of the operational amplifier has a high impedance, preferable in a range of $10^{11}$ to $10^{12}$ ohms. A blocking diode or a transistor connected as a blocking diode connects between the negative terminal of the operating voltage source and the reference voltage output. The circuit has a low noise component in the detector output signal and a constant amplification over a relatively broad frequency range, but is not particularly well-suited for systems testing mechanical shock and vibration because the baseline noise continues to expand throughout the operation.

SUMMARY OF THE INVENTION

Accordingly, an object of the present invention is to provide a testing system for fiber-optic components which has a circuit for detecting emitted infrared radiation.

Another object of the present invention is to provide a circuit for detecting emitted infrared radiation over a large bandwidth with little power consumption.

A further object of the present invention is to provide a circuit for detecting emitted infrared radiation having a signal-to-noise ratio of less than one percent.

Yet another object of the present invention is to provide a circuit for detecting emitted infrared radiation having little direct current drift over extended operating hours.

The present invention attains the foregoing and additional objects by providing a fiber-optic testing system having a detection circuit. The system comprises a means for emitting radiation, a means for optically coupling the emitted radiation, a circuit for detecting the emitted radiation and converting the emitted radiation into an electrical analog signal, and an analog tape recorder for recording the converted electrical analog signal onto a tape. The means for optically coupling the emitted radiation directs radiation beam onto the detecting circuit, and the detecting circuit electrically connects to the analog tape recorder.

The detection circuit comprises a means for amplifying voltage at high gain, a means for dividing voltage which is electrically connected in parallel to the means for amplifying, a photoelectric transducer which is electrically connected in series to the means for amplifying, and a power pack electrically connected to the means for amplifying. These components are mounted on a nonconductive board. This mounting board preferably has low capacitance and low-noise characteristics. The detecting circuit operates by having the photoelectric transducer sense the emitted radiation coming from the optic coupler and convert the radiation into an electrical signal. The means for amplifying then amplifies the signal to the voltage necessary for driving the tape recorder.

The testing system preferably comprises a plurality of detection circuits or channels. Each channel is completely isolated from the other channels and all are mounted on the same non-conductive board. Preferably, the means for amplifying is a monolithic operational amplifier having a group of in-line pin connections including an inverting input, a non-inverting input, an output, and positive and negative voltage supply inputs. The means for dividing voltage is a ten-turn wire-wound potentiometer which is electrically connected on one end to the inverting input and on the other end to the output of the operational amplifier. Also in the preferred embodiment, the photoelectric transducer is a pin photo diode connected in series with the inverting input of the operational amplifier and having an area of detection of 500 microns. The power pack is preferably a twelve volt, 100 milli-ampere battery.

DETAILED DESCRIPTION OF THE INVENTION

Figure 1:
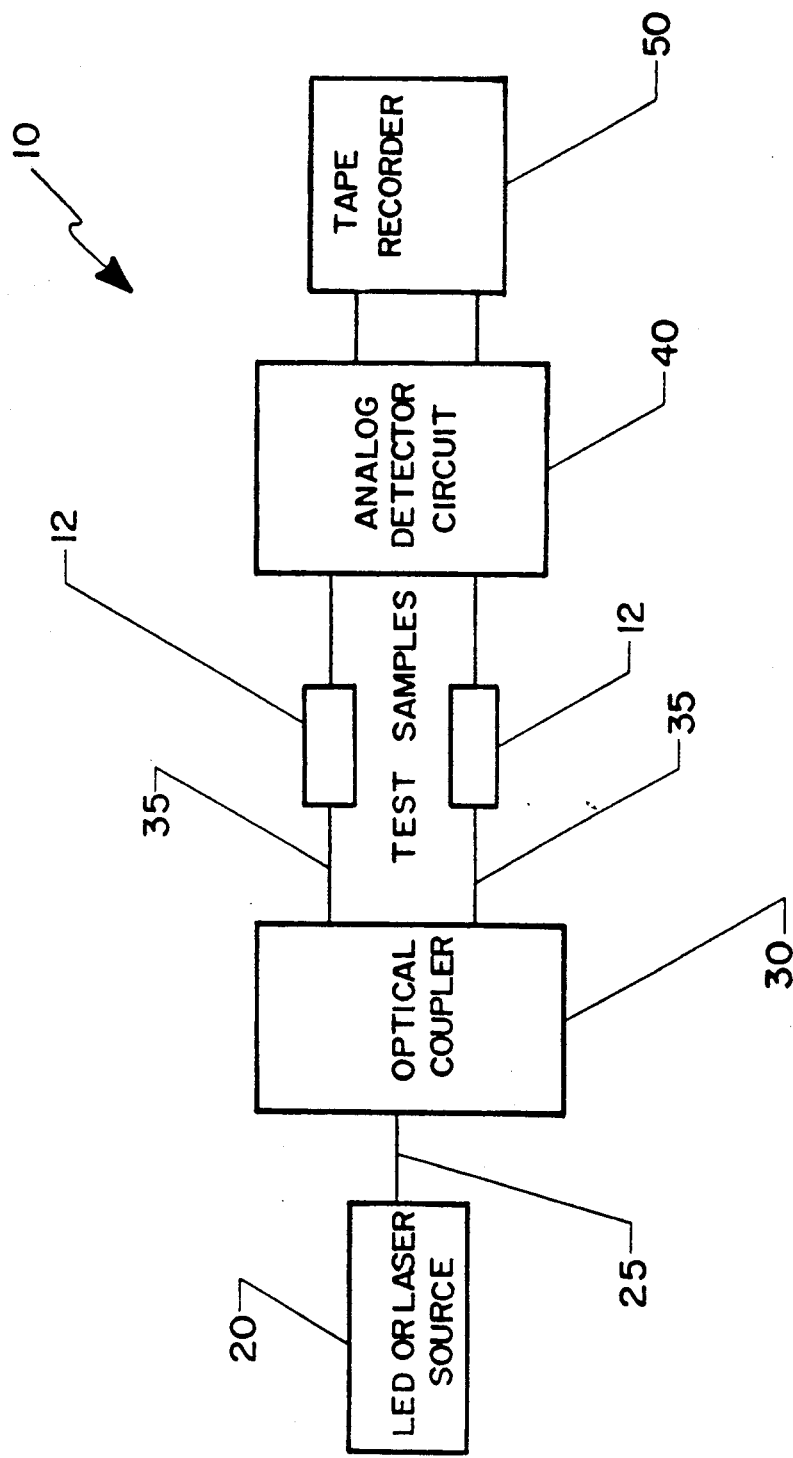
FIG. 1 is a schematic diagram showing a fiber-optic testing system of the present invention.

Referring now to FIG. 1, a schematic diagram illustrates a fiber-optic testing system 10 used to test fiber-optic components 12. The system 10 comprises a means for emitting radiation or source 20, a means for optically coupling the emitted radiation 30, a circuit for detecting and converting the radiation 40, and an analog tape recorder 50. The system operates by having the source 20 emit infrared radiation 25 at a wavelength of approximately 1300 nanometers. Because the fiber-optic components 12 typically outnumber the supply of radiation sources, the system 10 uses the coupler 30 to increase the number of radiation beams 35 directed upon the fiber-optic components 12. The coupler, however, introduces optic attenuation which can reach as high as 8dB and can create difficulties in generating a recordable electrical signal. As a result, the detection circuit 40 must not only convert the emitted radiation into an electrical signal but must also amplify this signal to an output voltage which can drive the analog tape recorder 50. Thus, the detection circuit 40 is a novel and important feature of the present invention.

Figure 2:
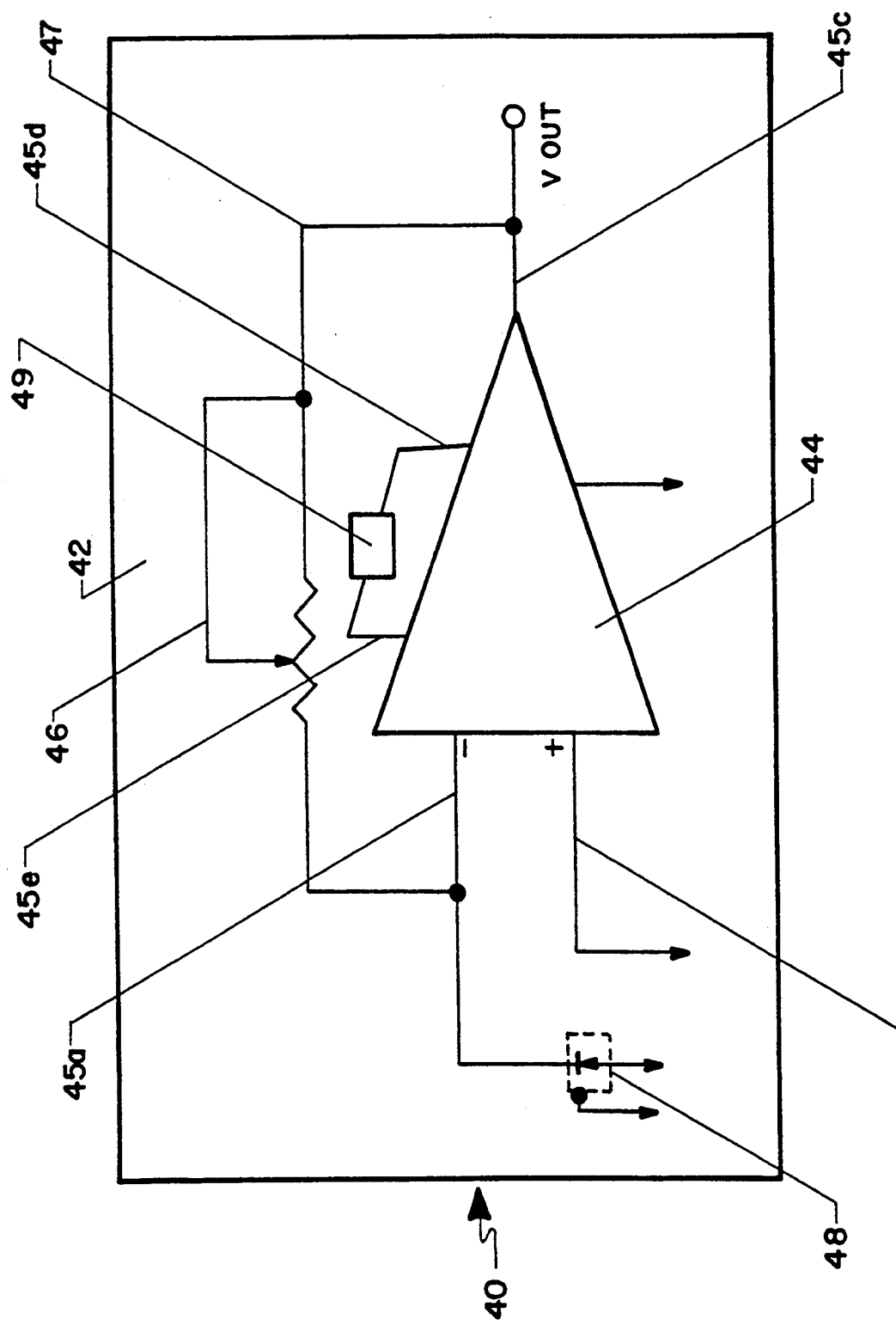
FIG. 2 is a schematic diagram showing a detection circuit of the present invention.

FIG. 2 represents a circuit layout of the detecting circuit 40 of the present invention. The detecting circuit 40 comprises a non-conductive mounting board 42, a means for amplifying voltage at high gain or amplifier 44, a means for dividing voltage 46, a means for transducing voltage 48, and a means for generating electrical energy or power pack 49.

The mounting board 42 is the base upon which the electrical components of detecting circuit 40 is constructed. Preferably, the testing system 10 comprises a group of detection circuits or channels 40. Each channel, for ideal performance, should be completely isolated from each other, although each is mounted on the same board. By being non-conductive, the board 42 eliminates channel interaction and parasitic capacitance effects and thereby avoids low-noise techniques typically required on a standard circuit board.

The amplifier 44 mounts to the board 42 and has a plurality of in-line connections including an inverting input 45a, a non-inverting input 45b, an output 45c, a positive voltage supply input 45d, and a negative voltage supply input 45e. Preferably, the amplifier 44 is a monolithic operational amplifier such as a Burr-Brown OPA 128. The means for dividing voltage 46 is electrically connected in parallel in the feedback branch 47 of the amplifier 44. In other words, the means for dividing connects on one end to the inverting input 45a and on the other end to the output 45c of the amplifier. In the preferred embodiment, the means for dividing is a ten-turn wire-wound potentiometer.

Another electrical component of detecting circuit 40 is the means for transducing 48, which is electrically connected in series with the inverting input 45a. The transducer 48 senses the emitted radiation coming from the optic coupler 30 and through the fiber-optic component 12 and converts the radiation into an electric signal which the amplifier 44 in turn amplifies. The transducer 48 is preferably a pin photo diode which includes the elements of indium, gallium, and arsenide in its construction and has a dark current of 50 nanoamperes, a capacitance of 20 picofarads, a responsivity of 0.75 amperes per watt, and an area of detection of 500 microns.

The power pack 49 supplies the power required to start-up and drive the detection circuit. The power pack connects to the positive voltage supply input 45d and the negative voltage supply input 45e of the amplifier. In the preferred embodiment, the power pack supplies twelve volts at 100 milliamperes of current.

Figure 3:
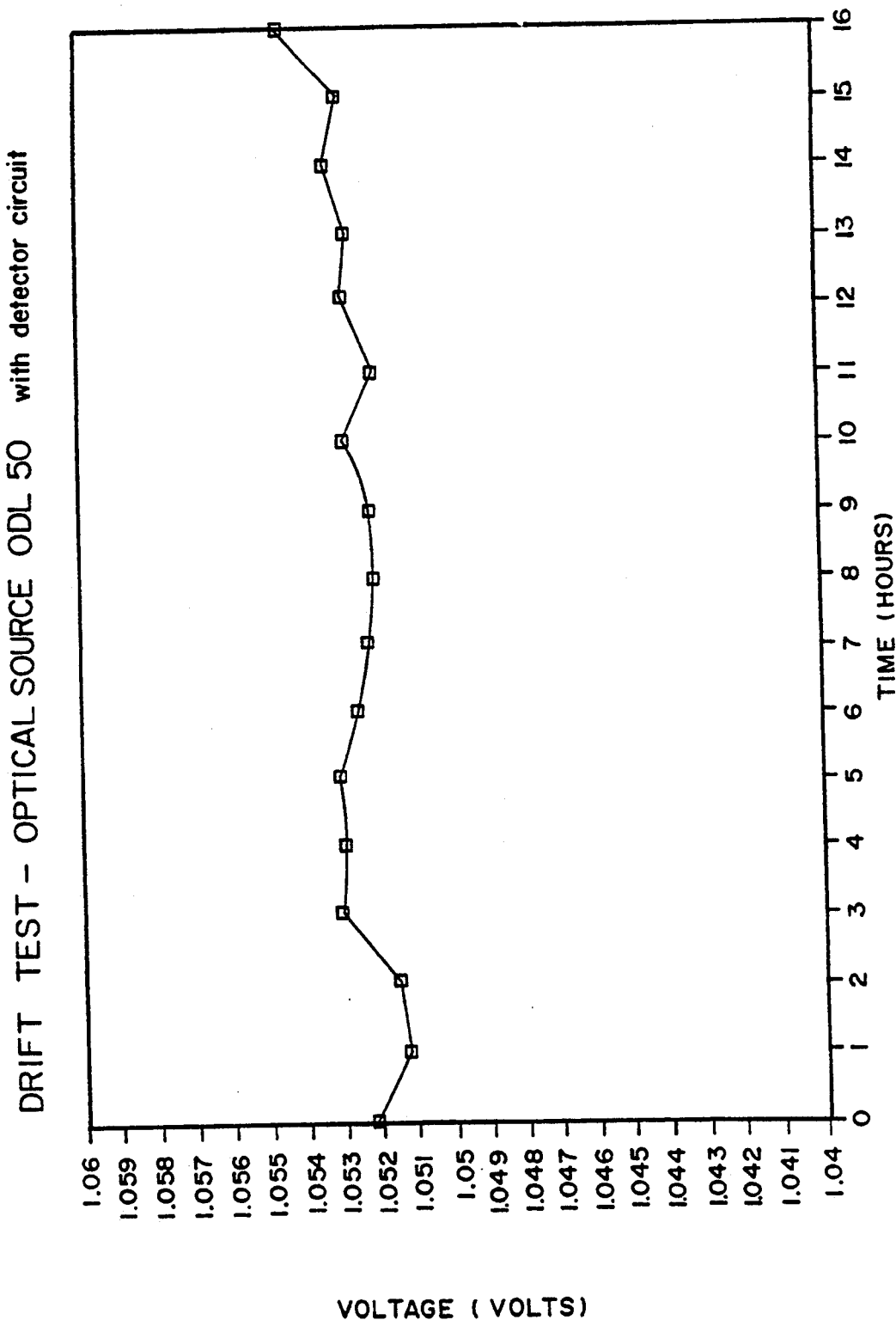
FIG. 3 shows the results of a drift test for the detection circuit.
Figure 4:
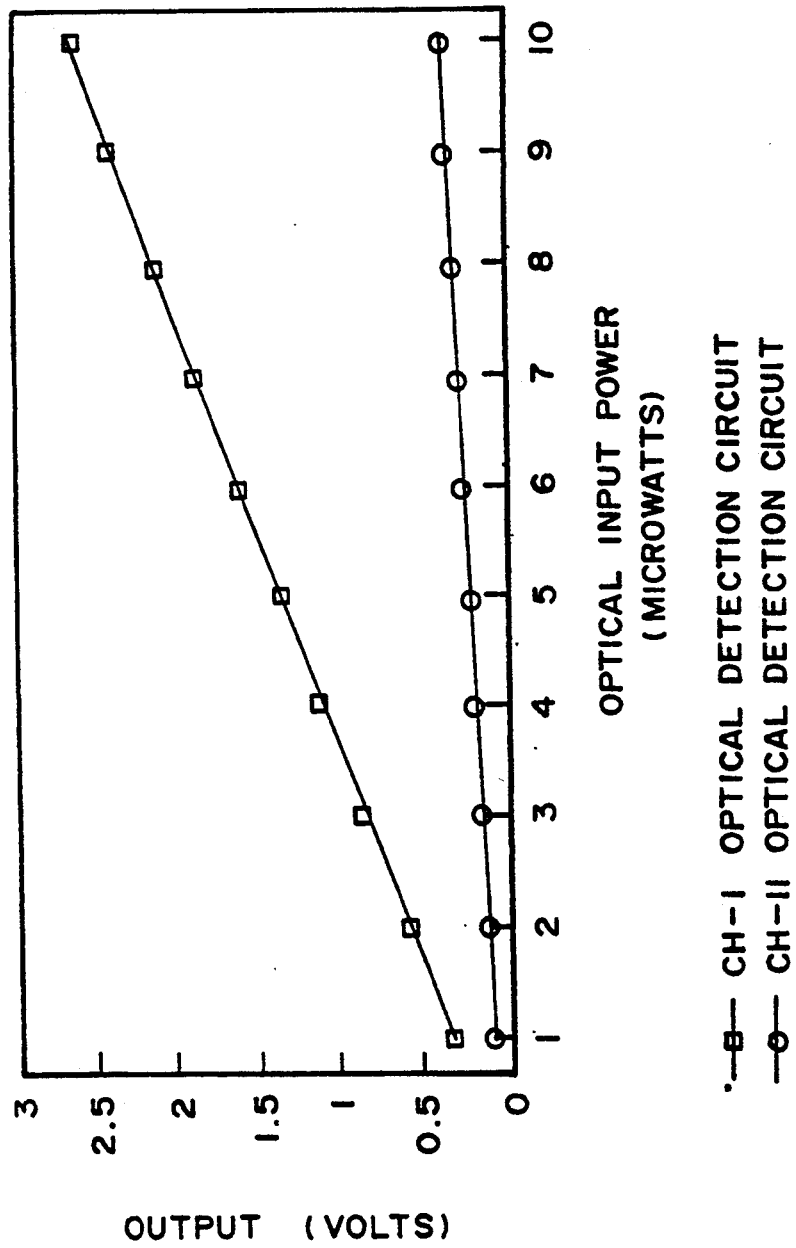
FIG. 4 shows the results of a linearity test for the detection circuit.

The detection circuit 40 has several unique advantages. First, the bandwidth of frequency response ranges from direct current to greater than 100KHz while the output voltage of the amplifier is 0.5 volt DC analog with a 1 microwatt optical input. Also, the signal-to-noise ratio of the circuit is less than one percent. As shown in FIG. 3, the circuit has a direct current stability which is less than 1mV for a sixteen-hour period. Additionally, FIG. 4 indicates the precise linearity of the circuit, which gives a predictable relationship between the input of radiation and the output of voltage.

The detection circuit provides these advantages because it has key low-noise characteristics. First, the circuit achieves high bandwidth by keeping the parasitic capacitance of the potentiometer in the feedback branch the same as the capacitance of the detector. The circuit also has an ultra low-bias current which reduces a significant thermal DC voltage drift caused by the temperature coefficient of the amplifier's input current. This low-bias current also eliminates a noise-causing resistor on the non-inverting input, and, as a result, the input noise current and the voltage noise of the amplifier become negligible. Another low-noise characteristic is the capacitance of the photoelectric transducer, which gives low shot noise and thereby forms a noise gain of zero with the potentiometer in the feedback branch. The photoelectric transducer also has the characteristic of no direct current bias. This characteristic reduces the generation of current noise from the transducer and eliminates the need for a second power supply, which would have become another noise source. The circuit also has only one resistor (the potentiometer), which reduces a large percentage of the existing thermal noise. Actual tests indicate that the overall measured level of noise is approximately 3mV, a significant reduction from the noise level of approximately 200mV for the commercially available prior art.

The novel features of this invention include the existence of one potentiometer only in the feedback branch of the amplifier in the detection circuit and the existence of a non-conductive board as a base for mounting the electrical components of the circuit. The benefits and advantages of these features include keeping the parasitic capacitance of the potentiometer the same as the capacitance of the photoelectric transducer. This benefit enables the circuit to achieve a high bandwidth of frequency response with little power consumption. Other benefits and advantages include the ability to reduce the overall noise level of the circuit by eliminating channel interaction among multiple circuits and thereby avoiding the typical low-noise techniques for a standard circuit board.

Although the invention has been described relative to a specific embodiment thereof, there are numerous variations and modifications that will be readily apparent to those skilled in the art in the light of the above teachings. It is therefore to be understood that, within the scope of the appended claims, the invention may be practiced other than as specifically described.

What is claimed as new and desired to be secured by Letters Patent of the United States is:

1. A circuit for detecting emitted radiation, comprising:
    a means for mounting and isolating a plurality of circuit components;
    a means for amplifying voltage at a high-gain, said means for amplifying being mounted to said means for mounting and isolating, said means for amplifying also having a plurality of in-line pin connections;
    a means for dividing voltage, said means for dividing being electrically connected in parallel to said means for amplifying;
    a means for optically transducing infrared radiation, said means for optically transducing being electrically connected in series to said means for amplifying; and
    a means for generating electrical energy, said means for generating being electrically connected to said means for amplifying and supplying voltage directly to said means for amplifying.

2. A circuit for detecting emitted radiation as recited in claim 1 wherein said means for mounting and isolating is non-conductive.

3. A circuit for detecting emitted radiation as recited in claim 1 wherein said means for mounting and isolating is a non-conductive, low capacitive, noise free board.

4. A circuit for detecting emitted radiation as recited in claim 1 wherein the plurality of in-line pin connections of said means for amplifying includes an inverting input, a non-inverting input, an output, a positive voltage supply input, and a negative voltage supply input.

5. A circuit for detecting emitted radiation as recited in claim 4 wherein said means for amplifying is a monolithic operational amplifier.

6. A circuit for detecting emitted radiation as recited in claim 5 wherein the monolithic operational amplifier is a Burr-Brown Model Number OPA-128.

7. A circuit for detecting emitted radiation as recited in claim 4 wherein said means for dividing is electrically connected on one end to the inverting input of said means for amplifying and on the other end to the output of said means for amplifying.

8. A circuit for detecting emitted radiation as recited in claim 7 wherein said means for dividing is a ten-turn wire wound potentiometer.

9. A circuit for detecting emitted radiation as recited in claim 4 wherein said means for optically transducing is electrically connected in series with the inverting input of said means for amplifying.

10. A circuit for detecting emitted radiation as recited in claim 9 wherein said means for optically transducing is a pin photo diode.

11. A circuit for detecting emitted radiation as recited in claim 10 wherein the pin photo diode includes the elements of indium, gallium, and arsenide in its construction.

12. A circuit for detecting emitted radiation as recited in claim 11 wherein the pin photo diode has a dark current of 50 nanoamperes, a capacitance of 20 picofarads, a responsivity of 0.75 amperes per watt, and an area of detection of 500 microns.

13. A circuit for detecting emitted radiation as recited in claim 4 wherein said means for generating electrical energy is electrically connected to the positive voltage supply input and the negative voltage supply input.

14. A circuit for detecting emitted radiation as recited in claim 13 wherein said means for generating electrical energy is a twelve volt, 100 milliampere power pack.

15. An apparatus for testing a fiber-optic component, comprising:
    means for emitting infrared radiation;
    means, positioned between said means for emitting and a fiber-optic component, for optically coupling the emitted radiation onto the fiber-optic component;
    means, positioned near the fiber-optic component, for detecting the emitted radiation passing the fiber-optic component and converting the emitted radiation into an electrical analog signal, said means for detecting and converting comprising a non-conductive channel isolating mounting board, a means for amplifying voltage at a high-gain, said means for amplifying being mounted to said mounting board, a means for dividing voltage, said means for dividing being electrically connected in parallel to said means for amplifying, a means for optically transducing infrared radiation, said means for optically transducing being electrically connected in series to said means for amplifying, and a means for generating electrical energy, said means for generating being electrically connected to said means for amplifying and supplying voltage directly to said means for amplifying; and
    means, connected to said means for detecting and converting, for recording the converted electrical analog signal onto an analog tape.

16. An apparatus for testing a fiber-optic component as recited in claim 15 wherein said means for amplifying is a monolithic operational amplifier.

17. An apparatus for testing a fiber-optic component as recited in claim 15 wherein said means for dividing voltage is a ten-turn wire would potentiometer.

18. An apparatus for testing a fiber-optic component as recited in claim 15 wherein said means for optically transducing infrared radiation is a pin photo diode having a dark current of 50 nanoamperes, a capacitance of 20 picofarads, a responsivity of 0.75 amperes per watt, and an area of detection of 500 microns.

19. An apparatus for testing a fiber-optic component as recited in claim 15 wherein said means for generating electrical energy is a twelve volt, 100 milliampere power pack.

20. A circuit for detecting emitted radiation, comprising:

means for mounting and isolating a plurality of circuit components, said means for mounting and isolating being non-conductive;

means for amplifying voltage, said means for amplifying being mounted to said means for mounting and isolating, said means for amplifying also having a plurality of in-line pin connections; means for dividing voltage, said means for dividing being electrically connected in parallel to said means for amplifying; and means for optically transducing infrared radiation, said means for optically transducing being electrically connected in series to said means for amplifying.

* * * * *